(12) United States Patent
Ulmer et al.

(10) Patent No.: US 9,198,299 B2
(45) Date of Patent: Nov. 24, 2015

(54) ELECTROHYDRODYNAMIC (EHD) PRINTING FOR THE DEFECT REPAIR OF CONTACT PRINTED CIRCUITS

(71) Applicant: Sharp Laboratories of America, Inc., Camas, WA (US)

(72) Inventors: Kurt Ulmer, Vancouver, WA (US); Kanan Puntambekar, Chicago, IL (US); Lisa Stecker, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 476 days.

(21) Appl. No.: 13/711,192

(22) Filed: Dec. 11, 2012

(65) Prior Publication Data

US 2014/0158399 A1    Jun. 12, 2014

(51) Int. Cl.
  *H05K 1/00*  (2006.01)
  *H05K 3/22*  (2006.01)
  *H05K 3/12*  (2006.01)

(52) U.S. Cl.
  CPC .............. *H05K 3/225* (2013.01); *H05K 3/125* (2013.01); *H05K 2203/173* (2013.01)

(58) Field of Classification Search
  USPC .................. 174/250, 255–257, 268; 347/6–8, 347/20–21, 52, 55, 73–74, 112
  See application file for complete search history.

(56) References Cited

U.S. PATENT DOCUMENTS

2006/0289411 A1*  12/2006  Chang et al. .............. 219/121.73
2011/0187798 A1*  8/2011   Rogers et al. ................... 347/55

OTHER PUBLICATIONS

J.-U. Park et al., High-Resolution Electrohydrodynamic Jet Printing, Nature Materials 6, 782-789 (2007).

* cited by examiner

*Primary Examiner* — Tremesha S Willis
(74) *Attorney, Agent, or Firm* — Law Office of Gerald Maliszewski; Gerald Maliszewski

(57) ABSTRACT

A method is provided for repairing defects in a contact printed circuit. The method provides a substrate with a contact printed circuit formed on a substrate top surface. After detecting a discontinuity in a printed circuit feature, a bias voltage is applied to at least one of a first region of the printed circuit feature or a second region of the printed circuit feature. The bias voltage may also be applied to both the first and second regions. An electric field is formed between the bias voltage and an ink delivery nozzle having a voltage potential less than the bias voltage. Conductive ink is attracted into the electric field from the ink delivery nozzle. Conductive ink is printed on the discontinuity, forming a conductive printed bridge. Typically, the ink delivery nozzle is an electrohydrodynamic (EHD) printing nozzle.

13 Claims, 4 Drawing Sheets

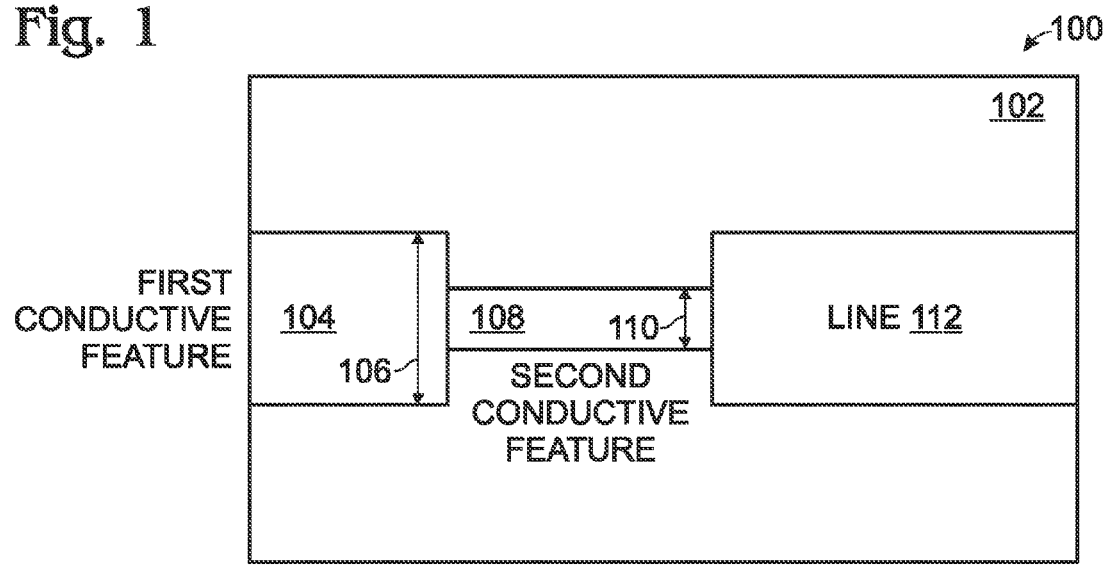
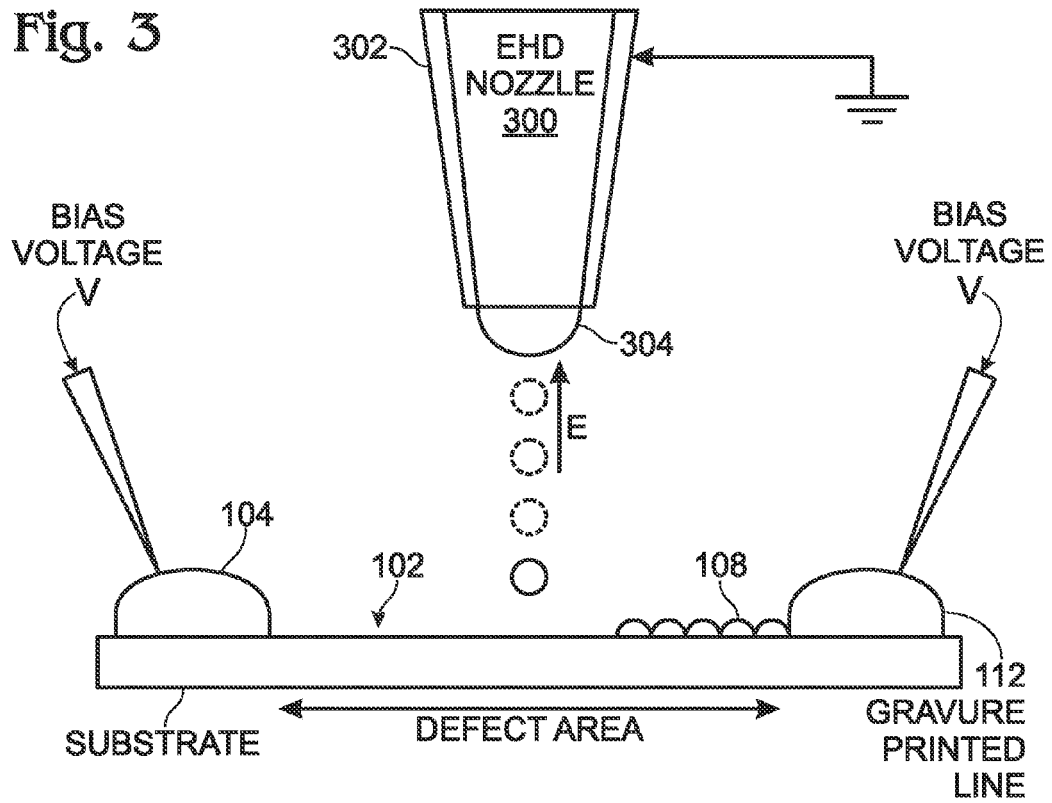

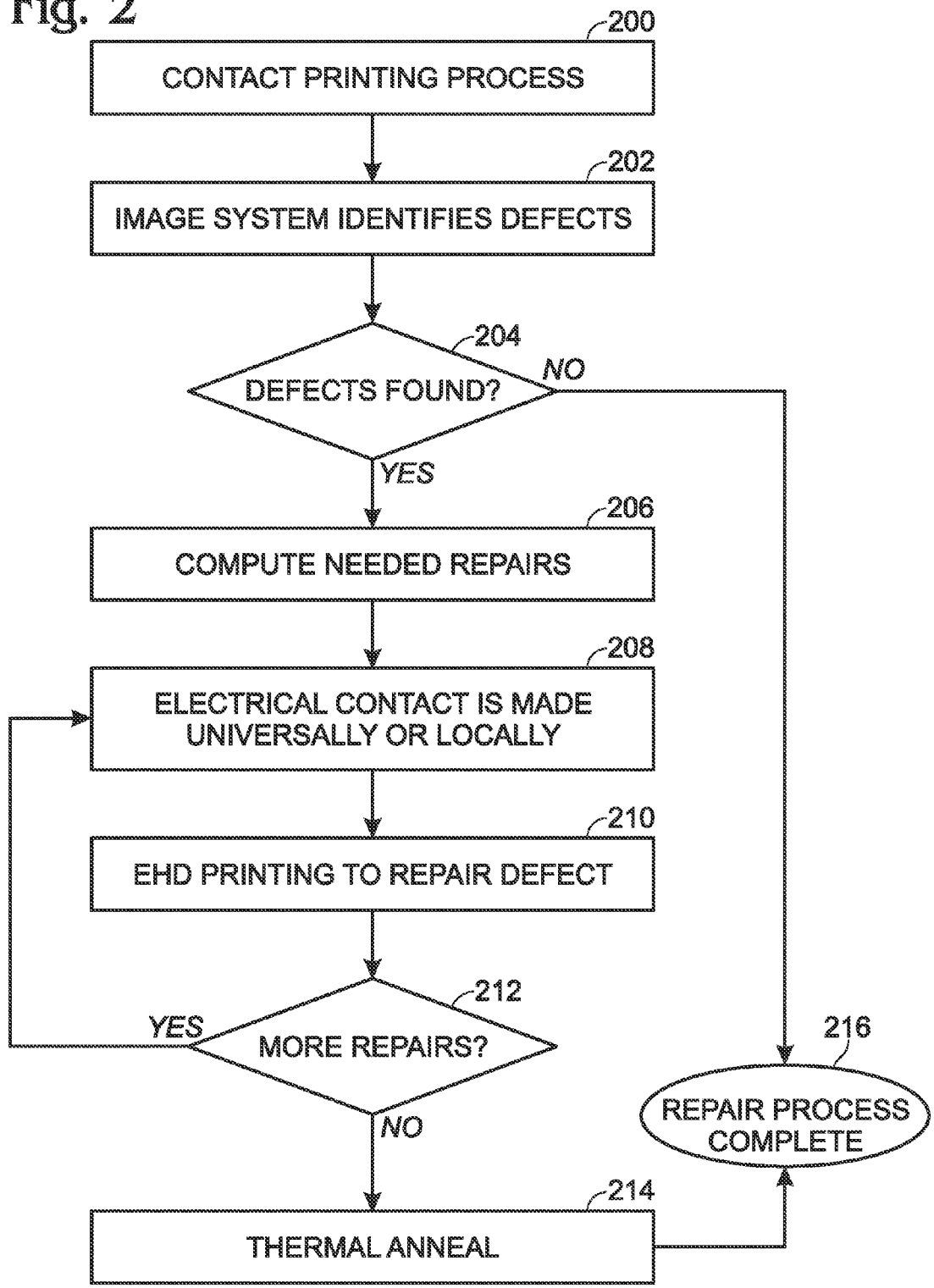

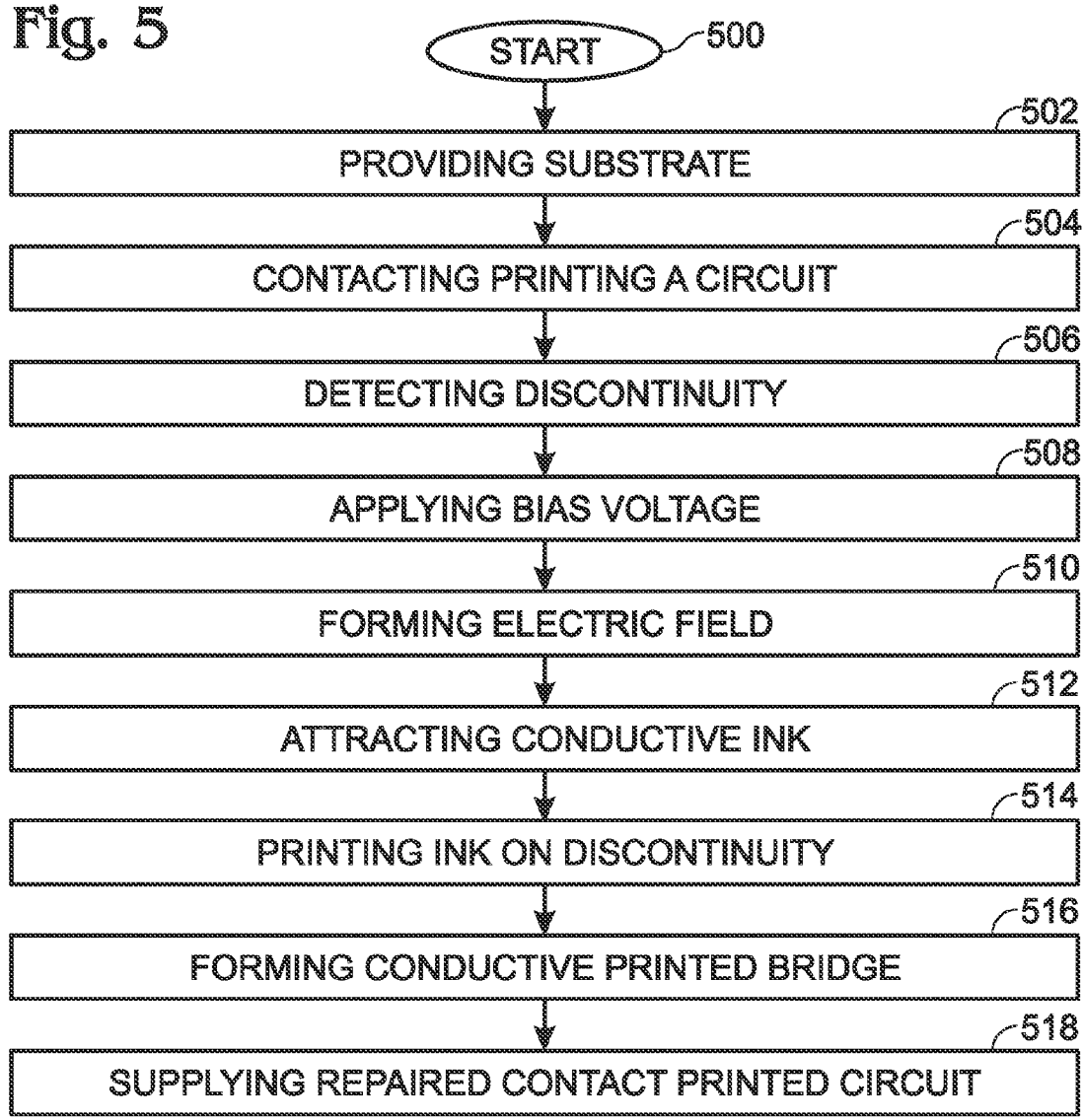

ELECTROHYDRODYNAMIC (EHD) PRINTING FOR THE DEFECT REPAIR OF CONTACT PRINTED CIRCUITS

BACKGROUND OF THE INVENTION

1. Field of the Invention

This invention generally relates to integrated circuit (IC) fabrication and, more particularly, to a method of repairing defects in contact printed electrical circuits using electrohydrodynamic (EHD) printing.

2. Description of the Related Art

As noted in Wikipedia, printed electronics is a set of printing methods used to create electrical devices on various substrates. Printing typically uses common printing equipment or other low-cost equipment suitable for defining patterns on material, such as screen printing, flexography, gravure, offset lithography and inkjet. Electrically functional electronic or optical inks are deposited on the substrate, creating for example, active or passive devices, such as thin film transistors or resistors. These processes can utilize any liquid phase material, including, but not limited to, solutions, mixtures, and dispersions containing organic semiconductors, inorganic semiconductors, organic dielectrics, inorganic dielectrics, metallic conductors, oxide conductors, organic conductors, nanowires, nanoparticles, nanotubes, and nanotubes.

The attraction of printing technology for the fabrication of electronics mainly results from the possibility of preparing stacks of micro-structured layers (and thereby thin-film devices) over large areas in simpler and cost-effective way, as compared to conventional electronics. Also, the ability to implement new or improved functionalities (e.g. mechanical flexibility) plays a role.

Organic field-effect transistors and integrated circuits can be prepared completely by means of mass-printing methods. The selection of print methods for the different layers is determined by dimensional requirements and the properties of printed materials, as well as economic and technical considerations of the final printed products. Optimal resolution of these considerations typically results in a combination of several print methods for the fabrications of the devices, as opposed to a single method.

Printed electronics permits the use of flexible substrates, which lowers production costs and allows fabrication of mechanically flexible circuits. While inkjet, aerosol-jet, and screen printing are used to pattern ink onto rigid substrates like glass and silicon, mass-printing methods nearly exclusively use flexible foil, polymers and paper.

Other methods with similarities to printing, among them micro contact printing and nano-imprint lithography, are of interest. Contact printing technologies of interest include flexography, gravure, screen printing, offset lithography, and variations of each of these techniques. In each of these cases a pattern is generated on a roller, stamp, plate, or screen prior to the printing process. Ink is applied to the pattern carrier and is then transferred to a substrate by the printing process. Here, micron and nanometer-sized layers are prepared by methods similar to stamping with soft and hard forms. Often the actual structures are prepared subtractively, e.g. by deposition of etch masks or by lift-off processes. For example, electrodes for OFETs can be prepared in this manner. Sporadically pad printing is used in a similar manner. Occasionally so-called transfer methods, where solid layers are transferred from a carrier to the substrate, are considered printed electronics.

The ink materials used must be available in liquid form, for solution, dispersion, or suspension. Additionally, they have varying functionality, to serve as conductors, semiconductors, dielectrics, or insulators. Metal inks are also commonly used in printed electronics for reasons of improved conductivity and potential for surface functionality, as compared to their organic counterparts. Silver, gold, and copper nanoparticle inks are used with all of the printing processes described above.

High throughput and fine feature reproduction capabilities make contact printing technologies attractive in printed electronics manufacturing. However, as with any manufacturing technique, defects can occur during the printing process. Defects in the pattern transfer could be expected from many sources. These sources may include contamination of the substrate, contamination of the ink, contamination of the pattern carrier, substrate surface imperfections, ink dispense, localized disturbances in substrate surface energy, and substrate surface roughness to name only a few. These defects may be reproduced over many print cycles or may be limited to a single printed pattern.

Defects that create a discontinuity in metal lines result in open circuit points, for example, that have a dramatic effect on the yield of the printed circuit. Also, due to the repetitive nature of contact printing techniques these defects can be reproduced many times throughout the printing cycle. It is difficult to imagine a contact printing process that would completely eliminate defects or that could identify, as well as repair, printed defects in a metal line.

It would be advantageous if defects in contact printed layers of printed electronics circuits could be repaired in real-time in a range of resolutions.

SUMMARY OF THE INVENTION

Disclosed herein is a method for the observation, recognition and, correction of defects in contact printed electronic circuits. High throughput and fine feature reproduction capabilities make contact printing technologies attractive in printed electronics manufacturing. The printing of 1-10 micron (μm) wide lines at rate of greater than 1 meter per second is becoming realizable by contact printing methods. Contact printing technologies of interest include flexography, gravure, screen printing, offset lithography, and variations of each of these techniques. In each of these cases a pattern is generated on a roller, stamp, plate, or screen prior to the printing process. Ink is applied to the pattern carrier and is then transferred to a substrate by the printing process.

It is reasonable to expect that the intended pattern transfer will never be completely accurate. A digital printing technology would be useful to repair defects that have occurred in a contact printed pattern. There are several established digital printing technologies in use for printed electronics including inkjet and electrohydrodynamic (EHD) printing. EHD has an advantage over conventional thermal and piezoelectric driven inkjet technologies because of the resolution that it is capable of printing. Typical printed feature sizes for conventional inkjet are around 30 μm, whereas EHD printed features are less than 10 μm. This makes EHD a suitable printing method for defect repair of contact printed features. The production of ink droplets in thermal and acoustically driven inkjet technologies is due to the interaction of a pressure wave in the ink with the nozzle opening at an edge of the ink chamber. This significantly limits the minimum size of the ink drops to be near the size of the nozzle opening. With EHD printing however, the ink drop is formed by the interaction of the charged ink with a powerful electrical field. It has been shown that the drop ejected from an EHD print nozzle can be much smaller than the nozzle opening. EHD printing has been shown capable of producing sub-micron sized features. Therefore, the EHD printing process can be used as a way of correcting print defects produced by high speed contact printing.

Accordingly, a method is provided for repairing defects in a contact printed circuit. The method provides a substrate with a contact printed circuit formed on a substrate top surface. After detecting a discontinuity in a printed circuit feature, a bias voltage is applying to at least one of a first region of the printed circuit feature and a second region of the printed circuit feature. The bias voltage may also be applied to both the first and second regions. For example, the discontinuity may be an open region in a printed circuit conductive line. An electric field is formed between the bias voltage and an ink delivery nozzle having a voltage potential less than the bias voltage. Conductive ink is attracted into the electric field from the ink delivery nozzle. Conductive ink is printed on the discontinuity, forming a conductive printed bridge, and eliminating the discontinuity.

In one aspect, detecting the discontinuity in the printed circuit feature includes optically analyzing the contact printed circuit, comparing the analyzed contact printed circuit image to a reference image, and discovering a discrepancy between the analyzed printed circuit image and the reference image.

Typically, the ink delivery nozzle is an EHD printing nozzle, and in addition to the electric field created, the EHD printing nozzle applies pressure to conductive ink in the nozzle. As a result, the conductive ink is printed in response to a combination of the conductive ink being attracted by the electric field, and the conductive ink being ejected from the EHD printing nozzle as a result of the pressure.

Additional details of the above-described method, and a repaired contact printed circuit, are provided below.

BRIEF DESCRIPTION OF THE DRAWINGS

FIG. 1 is a plan view of a repaired contact printed circuit.

FIG. 2 is a flowchart illustrating a defect repair process broken down into a series of components.

FIG. 3 is a cross-sectional view depicting an EHD printing operation.

FIG. 5 is a flowchart illustrating a contact printing method with defect repair.

DETAILED DESCRIPTION

Figure 4:
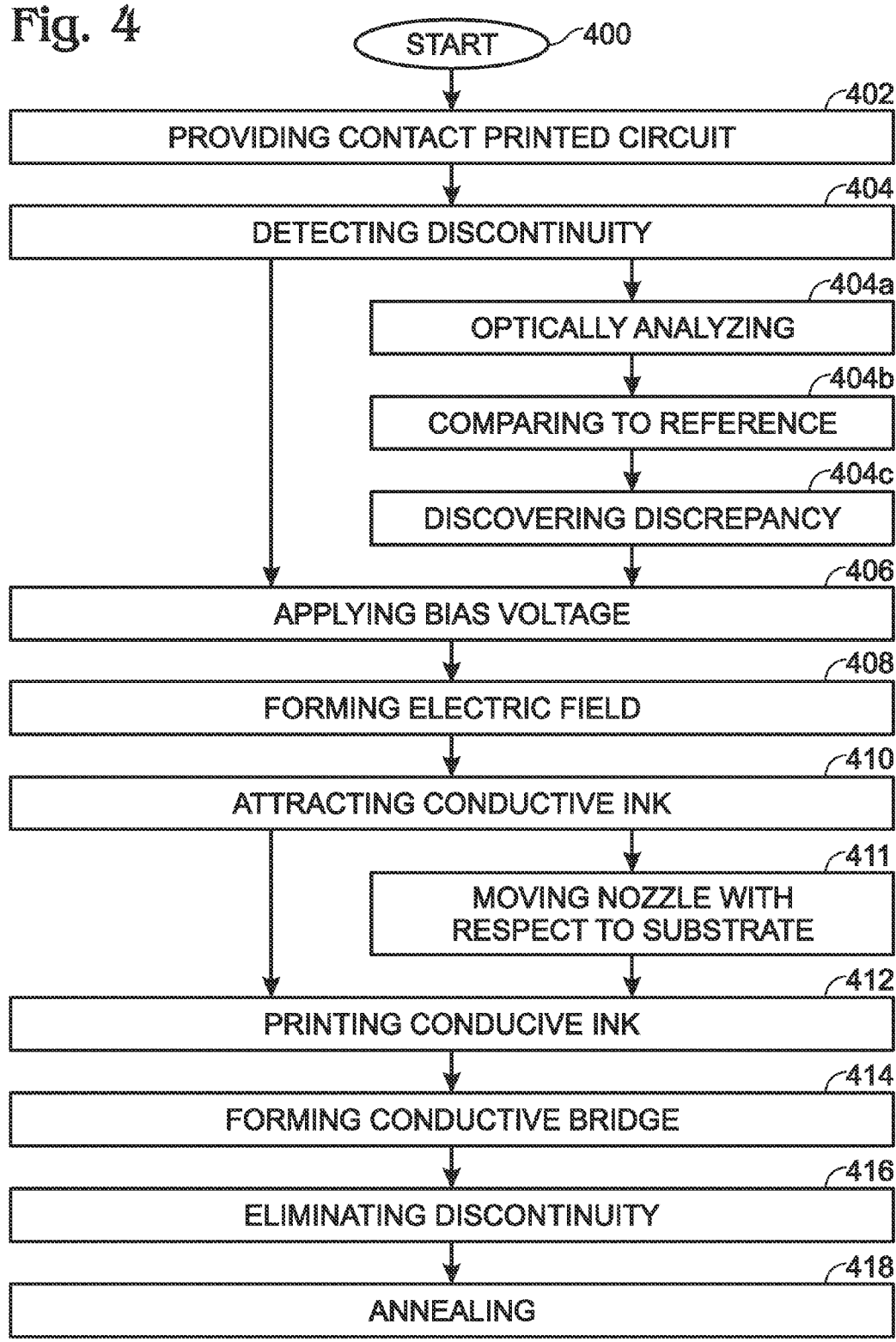
FIG. 4 is a flowchart illustrating a method for repairing defects in a contact printed circuit.

FIG. 1 is a plan view of a repaired contact printed circuit. The circuit 100 comprises a substrate with a top surface 102. A first conductive feature 104 overlies the substrate top surface 102 having a width 106 greater than about 5 microns. A second conductive feature 108 overlies the substrate top surface 102, and is electrically connected to the first conductive feature 104. The second conductive feature 108 has a width 110 of less than 1 micron. As shown, the first conductive feature 104 is a line, and the second conductive feature 108 is a line acting as a bridge to electrically connect the first conductive feature to another line 112. In other aspects not shown, a plurality of second features is formed in parallel between the first conductive feature 104 and line 112 to minimize resistance. Although straight lines have been depicted for simplicity, it should be understood that conductive features having a width of less than 1 micron can be formed between other conductive feature shapes (e.g., any shape capable of being formed by contact printing). As explained in more detail below, the first conductive feature is typically formed using a contact printing method and the second conductive feature is formed using an electrohydrodynamic (EHD) printing process.

FIG. 2 is a flowchart illustrating a defect repair process broken down into a series of components. The printing repair process described herein benefits from the high throughput of a contact printing process, such as gravure printing, as well as the defect repair that is enabled by a digital printing process like EHD. In this system, gravure printing, for example, generates a circuit pattern on a substrate with defects that need to be repaired.

After a contact printing process, as represented by Step 200, an imaging system is utilized to automatically observe the printed circuit (Step 202) and identify locations of defects from the gravure print (Step 204). This imaging system might consist of a camera or a series of cameras that captures the entirety of the printed circuit. Step 204 may be enabled using automated optical inspection (AOI). As noted in Wikipedia, AOI is an automated visual inspection of a wide range of products, such as printed circuit boards (PCBs). A camera autonomously scans the device under test (DUT) for variety of surface feature defects such as open circuits, short circuits, and thinning of the solder. The system is used inspecting parts that have limited and known variations. For defect or flaw detection, the AOI system looks for differences from a perfect part. There are systems capable of bare board inspection, solder paste inspection (SPI), as well as inspecting the component placement prior to reflow, the post-reflow component conditions, and post-reflow solder joints. These inspection devices all have some common attributes that affect capability, accuracy, and reliability. In this way AOI can be used to detect problems early in the production process. Since faults cost more to fix later in the production process, it is essential to notice problems early.

A machine vision or an AOI system can acquire millions of data points (pixels) in a fraction of a second. These data points are used for visual inspection and precision measurement. AOI visually scans the surface of the PCB. The board is lit by several light sources and observed by a scanner or by a number of high definition cameras. This enables the monitoring of all areas of the board, even those hidden in one direction by other components. It should be noted that each manufacturer of AOI systems utilizes different inspection algorithms and lighting techniques.

The light source may be light emitting diode (LED), fluorescent light, or in certain industries other light sources such as IR or UV. Another lighting method projects a pattern of light on an object, often by using a laser with a holographic lens or a white light source with an attached projection grid. The distortions of this structured light pattern can be measured and processed to recover the object's 3D structure. These techniques in the PCB industry are referred to as laser triangulation and phase shift profilometry Profilometer, respectively. Both are valid techniques for acquiring three-dimensional (3-D) information from the PCB.

The AOI system takes time to "learn" the object which in the PCB industry is typically a circuit board. Several methods of learning exist but the two most common are image matching and algorithm based, image matching is when a "golden board" is introduced to the system and the attributes of each component, solder deposit, etc. are learned into the system. This could include, but is not limited to color, white pixel count, dark pixel count, transition points, and relative position of transition points. Image based systems require a few example products typically to learn all possible variations. The other method is algorithm based programming; this is where the user can apply rules and measurement algorithms for inspection. Algorithm based programming typically also requires product examples for programming but not usually as many as image based programming.

In Step 206 the process identifies the type of defect observed in the previous step, and with knowledge of electrical function of the circuit, an appropriate repair is identified. Unknown defect types can be flagged for an operator to intervene to manually specify the repair that is needed.

In Step 208, the contact (e.g., gravure) printed metal lines are biased such that an electric field is generated between those lines and the EHD nozzle. Electrical contact can be made throughout the circuit via edge connections or local electrical contact can be made near the defect area through the use of fine probe tips. In Step 210 the defect is repaired by printing ink in or around a defect by EHD printing.

Electrohydrodynamic jet (EHD or e-jet) printing is a technique that uses electric fields, rather than thermal or acoustic energy, to create the fluid flows necessary for delivering inks to a substrate. EHD printing has been shown to be capable of producing fine feature sizes, of less than 10 µm, that are difficult to achieve with commercially available inkjet technologies. It has been shown that feature sizes can be produced that are much smaller than the EHD nozzle diameter.

FIG. 3 is a cross-sectional view depicting an EHD printing operation. In a typical EHD printing process, a glass microcapillary nozzle 300 is coated by a metal film 302 such as gold by a physical vapor deposition process such as sputtering or evaporation. The nozzle is brought into close proximity (30 µm) to a substrate with conductive features. Ink that is to be printed is introduced to this microcapillary nozzle and a pressure is applied to the system to create a conical meniscus of ink 304 at the nozzle tip. The conductive nozzle tip is electrically grounded and a bias is applied to the conductive feature (s). An electric field is introduced between the nozzle and the substrate. At a sufficiently high field, a charged droplet of ink ejects from the ink meniscus and is accelerated toward the substrate by the electric field. Printed patterns can be produced by controlling the rate of drop ejection, substrate movement speed, and direction of substrate movement.

In this manner, discontinuous conductive lines can be bridged with the EHD printing of metal nanoparticle inks. The inks can be (but are not limited to) silver (Ag), gold (Au), platinum (Pt), palladium (Pd), copper (Cu) based inks, or other metal based ink. In one aspect, EHD printing requires that the substrate to be conductive so that an electric field can exist between it and the nozzle tip. However, this process can be employed with any type substrate, such as glass, semiconductor, ceramic, or flexible plastic. Printing can be done on top a non-conductive region of substrate if that region is adjacent to conductive regions. In this way conductive regions can be bridged across a non-conducting region by EHD printing. Upon annealing, the metal nanoparticle inks are transformed into conductive pathways. In this way, defects such as electrical opens in a circuit can be repaired.

Returning to FIG. 2, Step 212 determines if additional repairs are required. Once all repairs are made, the metal nanoparticle ink can be thermally annealed (Step 214) to render the repaired areas electrically conductive, and in Step 216 the repair process is complete.

FIG. 4 is a flowchart illustrating a method for repairing defects in a contact printed circuit. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 400.

Step 402 provides a substrate with a contact printed circuit formed on a substrate top surface. The contact printing process may be gravure printing, flexographic printing, offset printing, screen printing, spin-on coating, stamping, or dip-coating. Step 404 detects a discontinuity in a printed circuit feature. For example, the discontinuity may be an open region in a printed circuit conductive line, which has a width of less than 50 microns. Step 406 applies a bias voltage to at least one of a first region of the printed circuit feature or a second region of the printed circuit feature. In one aspect, the bias voltage is applied to both the first and second regions of the printed circuit feature. Step 408 forms an electric field between the bias voltage and an ink delivery nozzle having a voltage potential less than the bias voltage. Step 410 attracts conductive ink into the electric field from the ink delivery nozzle. Step 412 prints the conductive ink on the discontinuity. Step 414 forms a conductive printed bridge. The conductive printed bridge typically has a width in the range of 1 to 10 microns. However, sub-micron widths are also possible. Step 416 eliminates the discontinuity. Subsequent to eliminating the discontinuity, Step 418 thermally anneals the contact printed circuit.

In one aspect, detecting the discontinuity in the printed circuit feature in Step 404 includes detecting an exposed region of non-conductive substrate located between the first and second regions of the printed circuit feature. Then, forming the conductive printed bridge in Step 414 includes covering the exposed region of non-conductive substrate with the conductive ink, and eliminating the discontinuity in Step 416 includes electrically connecting the first and second regions of the printed circuit feature.

In another aspect, detecting the discontinuity in the printed circuit feature ion Step 404 includes substeps. Step 404a optically analyzes the contact printed circuit. Step 404b compares the analyzed contact printed circuit image to a reference image, and Step 404c discovers a discrepancy between the analyzed printed circuit image and the reference image. Alternatively, an algorithm based programming technique may be used.

In one aspect, forming the electric field between the first and second regions of the printed circuit feature, and the ink delivery nozzle (Step 408) includes operating an EHD printing nozzle. As is understood in the art, in addition to the electric field, the EHD printing nozzle operates by applying pressure to conductive ink in the nozzle. Then, printing the conductive ink on the discontinuity in Step 412 includes printing the conductive ink in response to a combination of the conductive ink being attracted by the electric field, and the conductive ink being ejected from the EHD printing nozzle as a result of the pressure, In another aspect, Step 411 moves the EHD printing nozzle, with respect to the substrate, across the discontinuity. Then, printing the conductive ink on the discontinuity in Step 412 includes printing the conductive ink in response to a combination of the conductive ink being attracted by the electric field, the conductive ink being ejected from the EHD printing nozzle as the result of the pressure, and the movement of EHD printing nozzle with respect to the substrate.

FIG. 5 is a flowchart illustrating a contact printing method with defect repair. The method begins at Step 500. Step 502 provides a substrate with a top surface. Step 504 contact prints a circuit of electrically conductive features overlying the substrate top surface. Step 506 detects a discontinuity in a printed circuit feature. Step 508 applies a bias voltage to at least one of a first region of the printed circuit feature or a second region of the printed circuit feature. Step 510 forms an electric field between the bias voltage and an ink delivery nozzle having a voltage potential less than the bias voltage. Step 512 attracts conductive ink into the electric field from the ink delivery nozzle. Step 514 prints the conductive ink on the discontinuity. Step 516 forms a conductive printed bridge. Step 518 supplies a repaired contact printed circuit.

Provided are contact printing repair methods using EHD printing. Examples of particular materials and process steps have been presented to illustrate the invention. However, the invention is not limited to merely these examples. Other variations and embodiments of the invention will occur to those skilled in the art.

We claim:

1. A method for repairing defects in a contact printed circuit, the method comprising:
    providing a substrate with a contact printed circuit formed on a substrate top surface;
    detecting a discontinuity in a printed circuit feature;
    applying a bias voltage to at least one of a first region of the printed circuit feature and a second region of the printed circuit feature;
    forming an electric field between the bias voltage and an ink delivery nozzle having a voltage potential less than the bias voltage;
    attracting conductive ink into the electric field from the ink delivery nozzle;
    printing the conductive ink on the discontinuity;
    forming a conductive printed bridge; and,
    eliminating the discontinuity.

2. The method of claim 1 wherein detecting the discontinuity in the printed circuit feature includes detecting an open region in a printed circuit conductive line.

3. The method of claim 2 wherein detecting the open region in the printed circuit conductive line includes detecting the open region in a printed circuit conductive line having a width of less than 50 microns.

4. The method of claim 1 wherein detecting the discontinuity in the printed circuit feature includes detecting an exposed non-conductive section of the substrate located between the first and second regions of the printed circuit feature;
    wherein forming the conductive printed bridge includes covering the exposed region of the non-conductive section of the substrate with the conductive ink; and,
    wherein eliminating the discontinuity includes electrically connecting the first and second regions of the printed circuit feature.

5. The method of claim 1 wherein detecting the liscontinuity in the printed circuit feature includes:
    optically analyzing the contact printed circuit;
    comparing the analyzed contact printed circuit image to a reference image; and,
    discovering a discrepancy between the analyzed printed circuit image and the reference image.

6. The method of claim 1 wherein forming the electric field between the first and second regions of the printed circuit feature, and the ink delivery nozzle, includes operating an electrohydrodyna (EHD) printing nozzle.

7. currently amended) The method of claim 6 wherein operating the MID printing nozzle includes applying pressure to the conductive ink in the nozzle; and,
    wherein printing the conductive ink on the discontinuity includes printing the conductive ink in response to a combination of the conductive ink being attracted by the electric field, and the conductive ink being ejected from the MID printing nozzle as a result of the pressure.

8. The method of claim 7 further comprising:
    moving the EHD printing nozzle, with respect to the substrate, across the discontinuity; and,
    wherein printing the conductive ink on the discontinuity includes printing the conductive ink in response to a combination of the conductive ink being attracted by the electric field, the conductive ink being ejected from the EHD printing nozzle as the result, of the pressure, and the movement of EHD printing nozzle with respect to the substrate.

9. The method of claim 1 wherein providing the substrate with the contact printed circuit includes printing the contact printed circuit using a printing process selected from a group consisting of gravure printing, flexographic printing, offset printing, screen printing, spin-on coating, stamping, and dip-coating.

10. The method of claim 1 wherein forming the conductive printed bridge includes forming the conductive bridge with a width in a range of 1 to 10 microns.

11. The method of claim 1 further comprising;
    subsequent to eliminating the discontinuity, thermally annealing the contact printed circuit.

12. The method of claim 1 wherein applying the bias voltage includes applying the bias voltage to both the first and second regions of the printed circuit feature.

13. A contact printing method with defect repair, the method comprising:
    providing a substrate with a top surface;
    contact printing a circuit of electrically conductive features overlying the substrate top surface;
    detecting a discontinuity in a printed circuit feature;
    applying a bias voltage to at least one of a first region of the printed circuit feature and a second region of the printed circuit feature;
    forming an electric field between the bias voltage and an ink delivery nozzle having a voltage potential less than the bias voltage;
    attracting conductive ink into the electric field from the ink delivery nozzle;
    printing the conductive ink on the discontinuity;
    forming a conductive printed bridge; and,
    supplying a repaired contact printed circuit.

* * * * *